United States Patent [19]

Kondo et al.

[11] Patent Number: 5,656,858
[45] Date of Patent: Aug. 12, 1997

[54] SEMICONDUCTOR DEVICE WITH BUMP STRUCTURE

[75] Inventors: Ichiharu Kondo, Nagoya; Chikage Noritake, Ama-gun; Yusuke Watanabe, Obu, all of Japan

[73] Assignee: Nippondenso Co., Ltd., Kariya, Japan

[21] Appl. No.: 544,637

[22] Filed: Oct. 18, 1995

[30] Foreign Application Priority Data

Oct. 19, 1994 [JP] Japan .................................. 6-253949
Jan. 31, 1995 [JP] Japan .................................. 7-035942

[51] Int. Cl.$^6$ .......................... H01L 23/48; H01L 23/52; H01L 29/40
[52] U.S. Cl. .......................... 257/737; 257/738; 257/750; 257/751; 257/762; 257/763; 257/770; 257/778
[58] Field of Search .................................. 257/734, 737, 257/738, 750, 751, 762, 763, 764, 770, 778, 779, 780, 781

[56] References Cited

FOREIGN PATENT DOCUMENTS 2-63169A 3/1990 Japan .................................. 257/762
4-217323 8/1992 Japan .
6-177136 6/1994 Japan .

OTHER PUBLICATIONS

Wang: "Barriers Against Copper Diffusion into Silcon and Drift Through Silicon Dioxide", Mrs Bulletin/Aug. 1994, pp. 30–40.

Krist et al: "H in Ti thin films", Thin Solid Films, vol. 228 (1993) pp. 141–144.

Baba et al: "Fine Pitch Bumping for Tab", IMC 1994 Proceedings, Omiya, Apr. 20–22, 1994, pp. 408–413.

Kondo et al: "Formation of HIgh Adhesive and Pure Pt Layers on $TiO_2$", J.Vac.Sci.Technol.A vol. 10, No.6, Nov–Dec. 1992, pp. 3456–3459.

Proceedings of the 55th meeting of the Applied Physics Association of Japan 1994, p.617 19a–ZD-9.

Proceedings of the 55th meeting of the Applied Physics Association of Japan 1994, p.725 21p–ZD-5.

*Primary Examiner*—Carl W. Whitehead, Jr.
*Attorney, Agent, or Firm*—Cushman, Darby & Cushman IP Group of Pillsbury Madison & Sutro LLP

[57] ABSTRACT

A semiconductor device, which has a high adhesiveness to the Cu film and the barrier metal at the bump part or LSI wiring part of a flip chip, is disclosed. On a silicon substrate are formed a transistor as a functional element and a bump for making contact with the transistor and an external substrate. On the surface of the silicon substrate is formed a metallic film, and on the metallic film is formed an insulating film, and a part of the metallic film is exposed through a contact hole. On the metallic film within the contact hole is formed a barrier metal made of TiN, and on the barrier metal is formed a bonding layer made of Ti. On the bonding layer is formed a bump growing Cu film, and on the bump growing Cu film is formed a bump structure.

18 Claims, 9 Drawing Sheets

SEMICONDUCTOR DEVICE WITH BUMP STRUCTURE

CROSS REFERENCE TO RELATED APPLICATION

This application is based upon and claims the benefit of priority of the prior Japanese Patent applications No. 6-253949 filed on Oct. 19, 1994 and No. 7-35942 filed on Jan. 31, 1995, the contents of which are incorporated herein by reference.

BACKGROUND OF THE INVENTION

1. Field of the Invention

The present invention generally relates to a semiconductor device, and more particularly to a bump structure in flip chip bonding or an electrode structure of a semiconductor device.

2. Related Art

Recently, computer and other electronic instruments have been demanded to be higher integrated and mounted at a higher density for cost reduction. Along this trend, the flip chip mounting method has been in the limelight for the comparatively higher bonding strength and possible high-density mounting. In the flip chip mounting technique, a semispherical electrode (bump) is formed on the electrode lead part of a semiconductor element, a wiring pattern is formed in correspondence with the bump on an external substrate (hybrid IC substrate), and both the bump and the external substrate having the wiring pattern are disposed in opposition to each other and soldered to each other.

The bump inevitably becomes smaller when a semiconductor chip is miniaturized. As a bump of such structure, a technique disclosed in the Japanese Unexamined Patent Publication No. 4-217323 is known, in which Ti is formed by the sputtering method as a barrier metal on the lead of the electrode, and then a bump material is formed thereon by the evaporation method or the plating method.

However, in this case, when the work in process is subjected to heat treatment within a mixed gas with hydrogen and nitrogen in the secondary process to improve the electric characteristics, there is a problem that the Ti is made embrittlement due to hydrogen annealing and the mechanical strength of the bump is degraded.

Furthermore, as disclosed in the Japanese Unexamined Patent Publication No. 4-217323, the structure in which Ti is used for the barrier metal has a problem that the barrier metal is over-etched or under-etched due to uneven etching time, and this causes dispersion in the bump diameter, and as a result, there is dispersion in the bump strength. For example, FIG. 9 illustrates the relationship between the bump diameter and the bump strength. It is understood from FIG. 9 that, when the bump diameter varies from 220 µm to 160 µm, the bump strength lowers to about a half the strength thereof down from 300 gf/bump. When the bump diameter is downsized to 50 µm, the bump strength lowers to approximately 15 gf/bump.

If the bump diameter disperses by ±10 µm from 160 µm and 50 µm respectively due to etching and the strength when the bump diameters are 160 µm and 50 µm is supposed to be 1 in index, dispersions in the strength when the dump diameters are 160 µm and 50 µm are ones as illustrated in FIG. 10. That is, if the bump diameter has a dispersion of ±10 µm from 160 µm due to etching, the bump strength varies within a small range from 0.88 to 1.12 in index. However, if the bump diameter has a dispersion of ±10 µm from 50 µm, the bump strength has a large dispersion from 0.64 to 1.44 in index.

In LSI, for higher integration and higher-density mounting of electronic instruments, the miniaturization of wiring has drawn much attention, and Cu wiring having a low resistance for wiring materials and a high resistance to electromigration has drawn much attention as reported in, for example, Mori et al., "Electromigration endurance in TiWN/Cu/TiWN interconnection", (Proceedings of the 55th meeting of the Applied Physics Association of Japan, 1994, p.617, 19a-ZD-9).

On other hand, when Cu is used for the wiring, there is a problem that the adhesiveness to the barrier metal is so low that exfoliation may be caused as reported in, for example, Furuya et al., "Estimation of adhesivity between Cu and barrier metals by contact angle measurement", (Proceedings of the 55th meeting of the Applied Physics Association of Japan, 1994, p.725, 21p-ZD-5).

SUMMARY OF THE INVENTION

Firstly, the inventors of the present invention studied for the solution to the problem of the vulnerability due to hydrogen annealing described above by using TiN for the barrier metal material.

When TiN is used for the barrier metal in the flip chip mounting technique, however, the stable adhesiveness to the Cu film for bump growing or wiring can not be obtained. That is, the adhesiveness between TiN and the Cu film is so low that degradation in strength occurs at this contact part. In order to ensure a necessary bump strength, it is necessary to make the contact part between the barrier metal of TiN and Cu film large. However, this makes it difficult to miniaturize the bump root part diameter against the increase in the number of bumps due to higher integration, increases the area occupied by the bumps within a chip, and increases the manufacturing cost. Also in wirings, this makes it difficult to narrow the width of the wirings.

In view of the above problems, it is an object of the present invention to provide a semiconductor device which has a high adhesiveness between the Cu film and the barrier metal at the bump part of the flip chip or LSI wiring part.

The semiconductor device of the present invention is characterized by having a bonding layer composed of Ti disposed between the Cu film as an electrode material or a wiring material and the barrier metal. For the barrier metal, any one of TiN, W, TiW, W-N and TiW-N may be used.

According to the present invention, a bonding layer made of Ti is disposed between the Cu film and the barrier metal. The Ti has so high an adhesiveness both to the Cu film and the barrier metal that there is little exfoliation or degradation in strength.

Particularly, if the bonding layer made of Ti is disposed between the bump growing Cu film and the barrier metal, as the Ti has a high adhesiveness to both the bump growing Cu film and the barrier metal, it is unlikely that exfoliation and degradation in strength occur. Furthermore, if the film thickness of the bonding layer is set to 2 to 100 nm, the adhesiveness can be maintained to a constant level and the vulnerability due to hydrogen annealing described above can be restrained.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

Referring to the appended drawings, preferred embodiments will be described in which the present invention is materialized as a bump structure of a flip chip.

Figure 1:
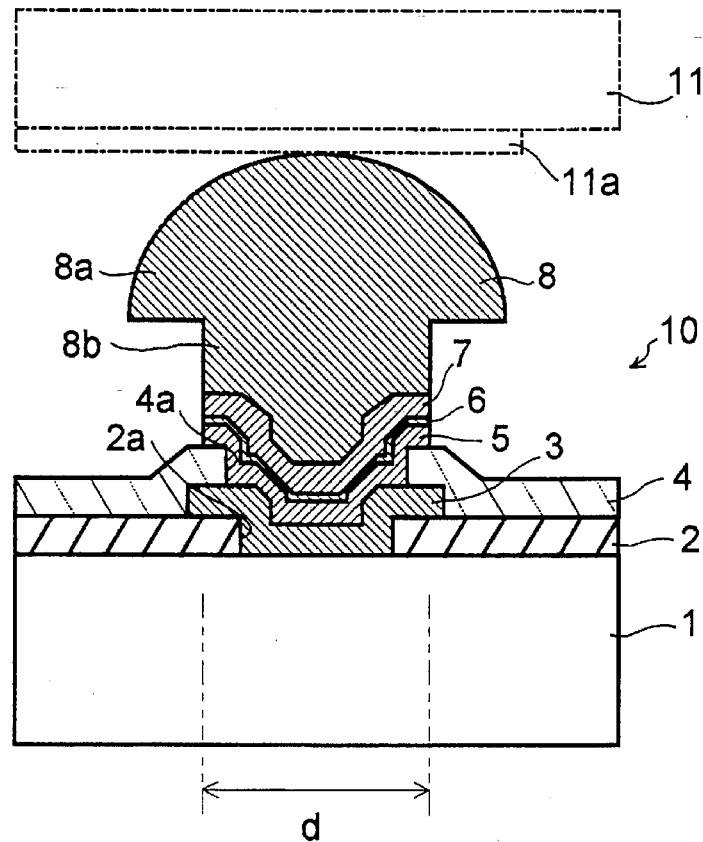
FIG. 1 is a cross-sectional view illustrating a semiconductor device according to a first embodiment.

FIG. 1 is a cross-sectional view illustrating the structure of the bump part of a flip chip 10 for a semiconductor device to which the first embodiment of the present invention is applied. This flip chip 10 is provided with a bump 8 made of Cu on a silicon substrate 1 (wafer).

On the silicon substrate 1 (wafer) is formed a transistor (not illustrated) as a functional element. In order for the transistor to make contact with an external substrate (hybrid IC substrate) 11, the bump 8 is used. That is, by bonding the bump 8 by means of soldering to a wiring pattern 11a of the external substrate 11, the transistor is electrically connected to the external substrate 11.

Then, the bump part will be described in detail.

The top (surface) of the silicon substrate 1 is covered with a silicon oxide film 2. In a part of the oxide film 2 is made an opening part 2a to expose a part of the silicon substrate 1. On the oxide film 2 including the inside of the opening part 2a is disposed a metallic film 3 in a specified pattern. The metallic film 3 is made of aluminum containing Si and Cu to a thickness of 0.5 to 1.5 μm.

On the metallic film 3 is formed an insulating film 4. For the insulating film 4 is used silicon nitride or the like of a film thickness of 1 to 2 μm. In a part of the insulating film 4 is formed a square or circular contact hole (opening part) 4a to expose a part of the metallic film 3. Here, instead of the oxide film 2 and the insulating film 4, a boro-phospho silicate glass film (passivation film) may be used.

On the insulating film 4 including the inside of the contact hole 4a are formed a thin film stack body composed of a barrier metal 5 in a specified pattern, a bonding layer 6 and a bump growing Cu film (bump base metal) 7. The barrier metal 5 is in conductive contact with the metallic film 3. The barrier metal 5 is made of TiN to obtain a barrier effect on the aluminum which is the material of the metallic film 3. The bonding layer 6 is made of Ti which is highly adhesive to the barrier metal 5 and the bump growing Cu film 7. As a barrier metal 5 and the bump growing Cu film 7 are bonded to each other through the bonding layer 6 made of Ti in this way, the adhesiveness between the barrier metal 5 and the bump growing Cu film 7 is high.

In addition, the bump growing Cu film 7 agrees with Cu which is a material of the bump 8. The film thickness of each film composing the thin film stack body is: 0.05 to 0.6 μm for the barrier metal 5; 2 to 100 nm for the bonding layer 6; and approximately 0.2 to 1.5 μm for the bump growing Cu film 7.

On the bump growing Cu film 7 is formed the bump 8 made of Cu by the electrolytic plating method. The bump 8 is composed of a spherical part 8a and a columnar root part 8b at the root of the spherical part 8a. The end surface of the root part 8b is in contact with the bump growing Cu film 7. The diameter (outside diameter) d of the root part 8b of the bump 8 is set to 30 to 250 μm.

Next, by referring to FIGS. 2A through 2C, the manufacturing method for the semiconductor device shown in FIG. 1 will be described.

Figure 2A:
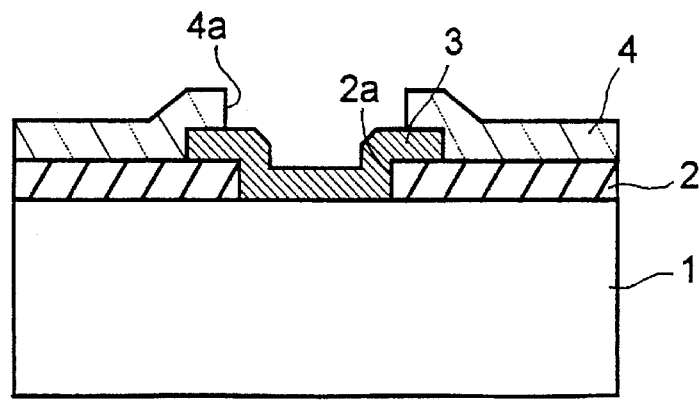
FIGS. 2A, 2B and 2C are cross-sectional views illustrating the manufacturing process of the semiconductor device according to the first embodiment.
Figure 2B:
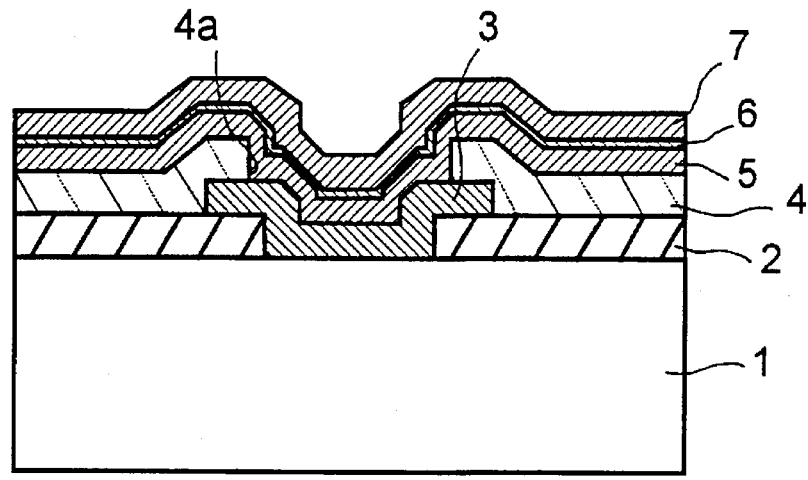

FIG. 2A illustrates the state of the silicon substrate (wafer) 1 before the bump 8 is formed thereon. Firstly, the oxide film 2 is formed on the surface of the silicon substrate 1, and then the opening part 2a is made in the oxide film 2. Secondly, the metallic film (Al film) 3 is formed on the oxide film 2 including the inside of the opening part 2a to a film thickness of 0.5 to 1.5 μm, and patterned to a specified pattern. Thirdly, the insulating film 4 (SiN or the like of a film thickness of 1 to 2 μm) is formed on the oxide film 2 including the top of the metallic film 3. Fourthly, the square or circular contact hole (opening part) 4a is patterned to a part of the insulating film 4 to expose a part of the metallic film 3.

In the following barrier metal forming process illustrated in FIG. 2B, all over the insulating film 4 including the inside of the contact hole 4a are formed, by the sputtering method, the barrier metal (TiN film) 5 to a the thickness of 0.05 to 0.6 μm, the bonding layer (Ti film) 6 to a film thickness of 2 to 100 nm and the bump growing Cu film (bump base metal) 7 to a film thickness of 0.2 to 1.5 μm.

Figure 2C:
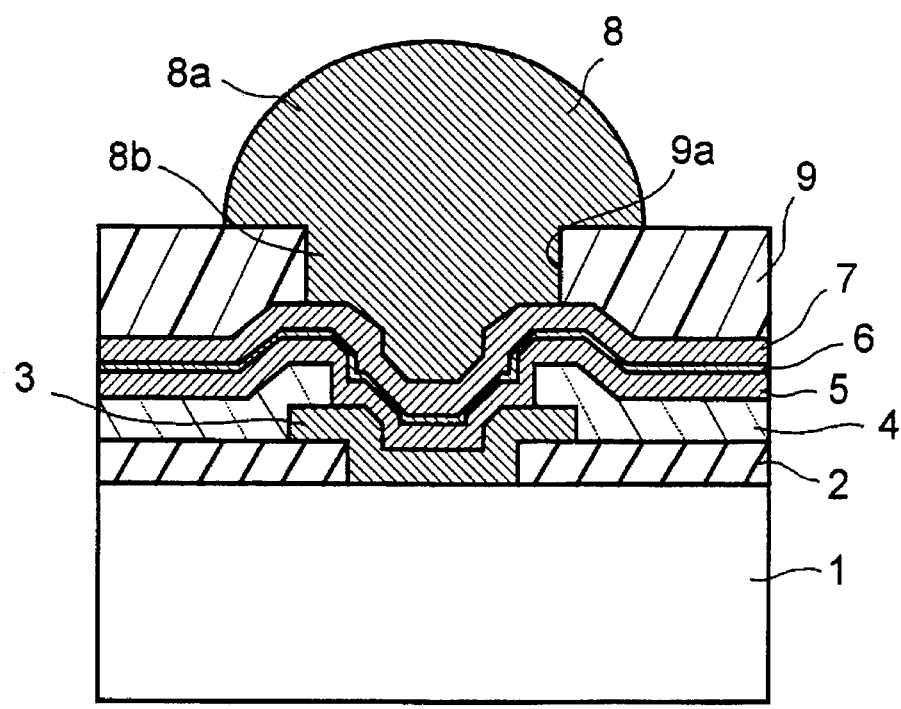

Furthermore, in the bump growing process by means of electrolytic plating illustrated in FIG. 2C, firstly, a photoresist film 9 is coated all over the wafer, and a window 9a for use in plating is made by the photolithographic process to expose a part of the bump growing Cu film 7. Secondly, by using the photoresist film 9 as a mask and the bump growing Cu film 7 as a plating electrode, a Cu film is grown up to a film thickness of, for example, 3 to 50 μm by the electrolytic plating method to form the bump 8. By this electrolytic plating, the bump 8 composed of the spherical part 8a and the columnar root part 8b is formed.

Then, in the process for patterning the thin film stack body of the bump growing Cu film 7, the bonding layer 6 and the barrier metal 5 as illustrated in FIG. 1, the photoresist film 9 is removed, and the bump growing Cu film 7, the bonding layer 6 and the barrier metal 5 are etched by using the bump 8 as a mask.

After the above process, in order to recover the transistor characteristics, the work in process is subjected to heat treatment within a mixed gas of nitrogen as a purge gas and hydrogen as a forming gas at a temperature of 350° to 450° C. for a duration of 5 to 60 min. In some cases, this heat treatment within the mixed gas of nitrogen and hydrogen is applied in an assembly soldering process for mounting chips to packages, etc.

In this heat treatment in the mixed gas of nitrogen and hydrogen, as the bonding layer (Ti film) 6 is thin and disposed on the barrier metal 5, there is no possibility that the Ti becomes vulnerable due to hydrogen annealing.

The inventors of the present invention made various experiments to check and confirm the improvement in the adhesiveness by forming the bump using the bonding layer 6 (Ti film). The results are summarized in FIGS. 3 through 5.

Figure 3:
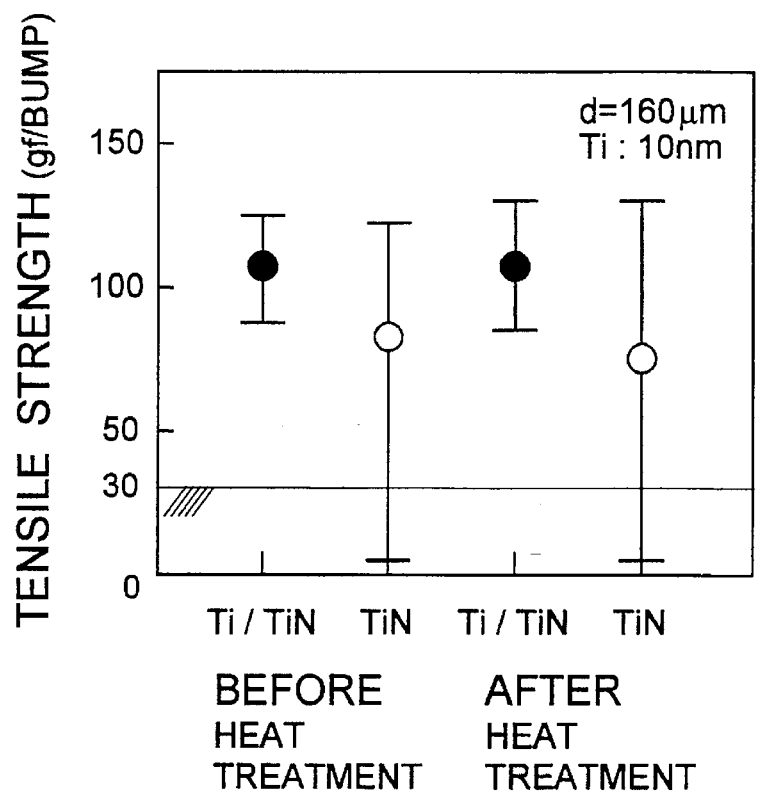
FIG. 3 is a graph illustrating the results of tensile strength measurement.

FIG. 3 illustrates the tensile strength measurement results for two cases: a case where the barrier metal 5 and the Cu film 7 were bonded directly to each other using TiN as the barrier metal, and a case where the barrier metal 5 and the Cu film 7 were bonded indirectly to each other but bonded through the bonding layer (Ti film) 6 using TiN as the barrier metal. As a measurement condition, the diameter d of the root part 8b of the bump 8 was set to 160 µm, and the film thickness of the bonding layer 6 was set to 10 nm. Tensile strength was also measured before and after the heat treatment within the mixed gas of nitrogen and hydrogen.

As the lower limit value (allowable lower limit value) of the tensile strength was set to 30 gf/bump, which is determined to be necessary for practical application. From FIG. 3, it is understood that in comparison with the case where the barrier metal 5 and the Cu film 7 were bonded directly to each other using TiN as a barrier metal, tensile strength distribution is narrower and the average value of the tensile strength distribution is larger in the case where the barrier metal 5 and the Cu film 7 were bonded indirectly to each other through the bonding layer (Ti film) 6 using TiN as a barrier metal (the average values of the tensile strength being indicated by ● for the latter case and ○ for the former case in FIG. 3). From this, it is further understood that the interposition of the bonding layer (Ti film) 6 narrows the tensile strength distribution, lessens product unevenness, increases the average of the tensile strength distribution, and thereby increases the adhesiveness between the barrier metal 5 and Cu film 7.

When the barrier metal 5 and the Cu film are bonded directly to each other using TiN as a barrier metal, the tensile strength higher than the lower limit value of 30 gf/bump can not be obtained (to be more precisely, each value in the tensile strength distribution can not be made more than 30 gf/bump). When the bonding layer (Ti film) 6 is interposed between the barrier metal 7 and the Cu film 7, however, the tensile strength of the lower limit value of 30 gf/bump or more can be obtained.

Figure 4:
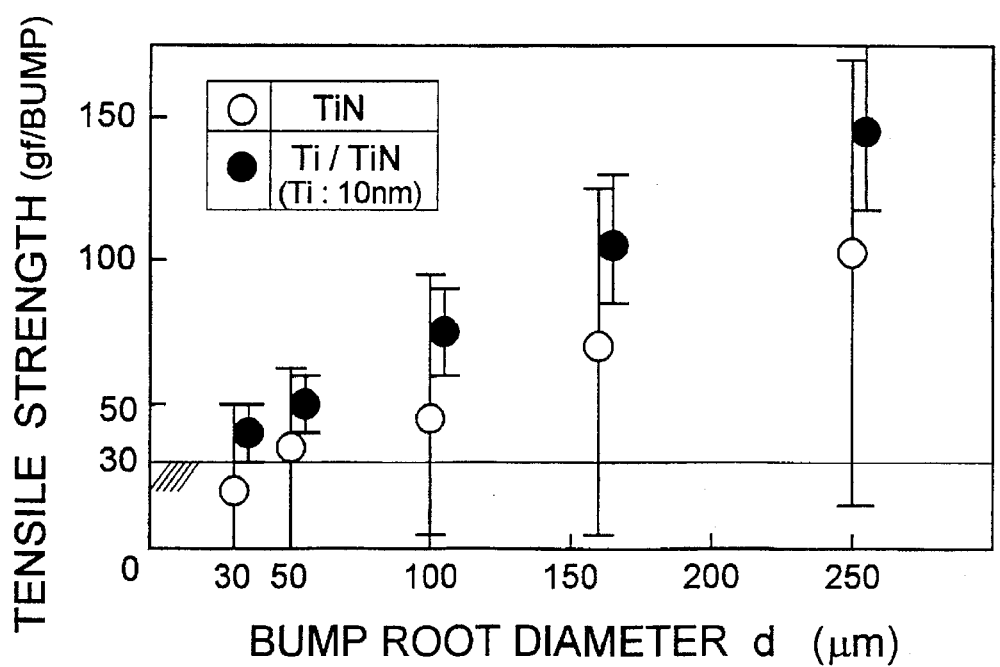
FIG. 4 is a graph showing the relationship between the tensile strength and the diameter of the bump root part.

FIG. 4 illustrates the measurement results of the tensile strength measured by changing the diameter d of the bump root part 8b for a case where the barrier metal 5 and the Cu film 7 were directly bonded to each other using TiN as the barrier metal 5 and for a case where the barrier metal 5 and the Cu film 7 were bonded indirectly to each other through the bonding layer (Ti film) 6 using TiN as the barrier metal. As a measurement condition, the film thickness of the bonding layer 6 was set to 10 nm.

From FIG. 4, it is understood that in comparison with the case where the TiN barrier metal 5 and the Cu film 7 were bonded directly to each other, tensile strength distribution is narrower at any diameter d of the bump root part 8b and the average value of the tensile strength distribution is larger in the case where the TiN barrier metal 5 and the Cu film 7 were bonded indirectly to each other through the bonding layer (Ti film) 6 (the average values of the tensile strength being indicated by ● for the latter case and ○ for the former case in FIG. 4). From this, it is further understood that the interposition of the bonding layer (Ti film) 6 narrows the tensile strength distribution, lessens product unevenness, increases the average of the tensile strength distribution, and thereby increases the adhesiveness of the barrier metal 5 and Cu film 7 to each other.

When the TiN barrier metal 5 and the Cu film 7 are bonded directly to each other, the tensile strength higher than the lower limit value of 30 gf/bump can not be obtained for any diameter d of the bump root part 8b (to be more precisely, each value in the tensile strength distribution can not be made more than 30 gf/bump). When the bonding layer (Ti film) 6 is interposed between the barrier metal 5 and the Cu film 7, however, if the diameter d of the bump root part 8b is set to 30 µm or more, the tensile strength of the lower limit value of 30 gf/bump or more can be obtained. In other words, if the diameter d of the bump root part 8b is set to 30 µm, the bump 8 can be miniaturized to the most extent for cost reduction while the necessary tensile strength is secured.

Figure 5:
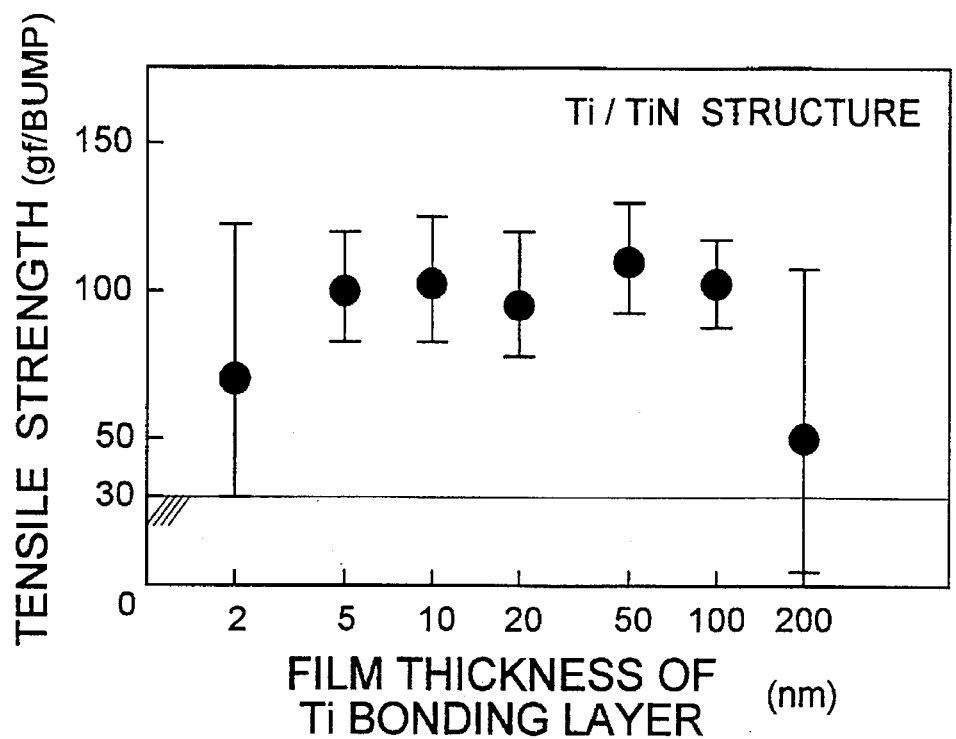
FIG. 5 is a graph showing the relationship between the tensile strength and the film thickness of the bonding layer.

FIG. 5 illustrates the measurement results of the tensile strength when the film thickness of the bonding layer (Ti film) 6 was changed under such a measurement condition that TiN was used as the barrier metal.

From FIG. 5, it is understood that in order to obtain the tensile strength of the lower limit value of 30 gf/bump or more, only the requirement is to set the film thickness of the bonding layer 6 to 2 to 100 nm. To be more precisely, if the film thickness of the bonding layer 6 is set to 2 to 100 nm, each value in the tensile strength distribution can be made more than 30 gf/bump or more. This is for the reason that if the film thickness of the bonding layer (Ti film) 6 is too thin, the bonding effect thereof is degraded, and if the film thickness of the same is too thick, the bonding layer becomes vulnerable.

As described above, according to this embodiment, the bonding layer 6 made of Ti is disposed between the Cu film 7, which is the electrode material, and the barrier metal 5. That is, on the barrier metal 5 formed on the metallic film 3 within the inside of the contact hole 4a is disposed the bump growing Cu film 7 through the bonding layer 6 made of Ti. The Ti has a high adhesiveness to both the Cu film 7 and the barrier metal 5, and has a resistance to exfoliation and degradation in strength. Therefore, the bump structure can be so stable as to be suitable for the miniaturization of the bump 8.

As TiN was used as the material of the barrier metal 5, a stable adhesiveness can be secured by using a specific, stable barrier metal material.

Furthermore, as the film thickness of the bonding layer 6 was set to 2 to 100 nm, as illustrated in FIG. 5, the tensile strength can be made to be the lower limit value of the of 30 gf/bump or more, and a stable adhesiveness can be secured.

Moreover, as the diameter d of the bump root part 8b was set to 30 µm or more, as illustrated in FIG. 4, the tensile strength of the lower limit value of 30 gf/bump or more can be obtained, and a stable adhesiveness can be secured. In other words, by setting the diameter d of the bump root part 8b to 30 µm or more and approximate to 30 µm, the bump 8 can be miniaturized and the integration of the semiconductor device can be heightened.

Besides the flip chip construction, the present invention may be embodied in LSI by using Cu wiring as a wiring material to miniaturize the wiring. That is, when this structure is described by referring to FIG. 1, it may be so constructed that the member denoted by the reference numeral 5 is an electrode, the member denoted by the reference numeral 7 is a Cu wiring, and the member denoted by the reference numeral 6 is a bonding layer made of Ti. Here, if the LSI wiring is of Al-alloy/Ti/TiN/Ti structure, as the Ti between the Al alloy and the TiN quickly make an intermetallic compound, it is difficult to use the LSI wiring. In contrast, Cu and Ti form only several-nanometer intermetallic compound in heat treatment undertaken in an ordinary process (400° to 500° C.), there is no adverse effect on the Cu film characteristics.

As a material of the barrier metal 5, any one of W, TiW, W-N and TiW-N may be used in lieu of TiN. In this case, the same characteristics as ones obtained when TiN is used can be obtained, and therefore a stable adhesiveness can be secured by using a specific, stable barrier metal material. That is, the inventors of the present invention has confirmed that even if W, TiW, W-N or TiW-N is used as a barrier metal, characteristic approximate to the characteristics illustrated in FIGS. 3 through 5 could be obtained.

In addition, when a nitride metal is used as a material of the barrier metal 5, a Ti layer may be formed before the formation of the barrier metal 5. In this case, there is an effect that the electrical continuity with the Al film 3 can be improved.

As described above, by interposing the Ti film 6 between the Cu film 7 and the barrier metal (TiN film or the like) 5, the adhesiveness between the Cu film 7 and the barrier metal 5 can be improved.

Next, an embodiment in which the diameter of the barrier metal is made substantially larger than the diameter of the bump to improve the strength of the bump structure will be described.

Figure 6:
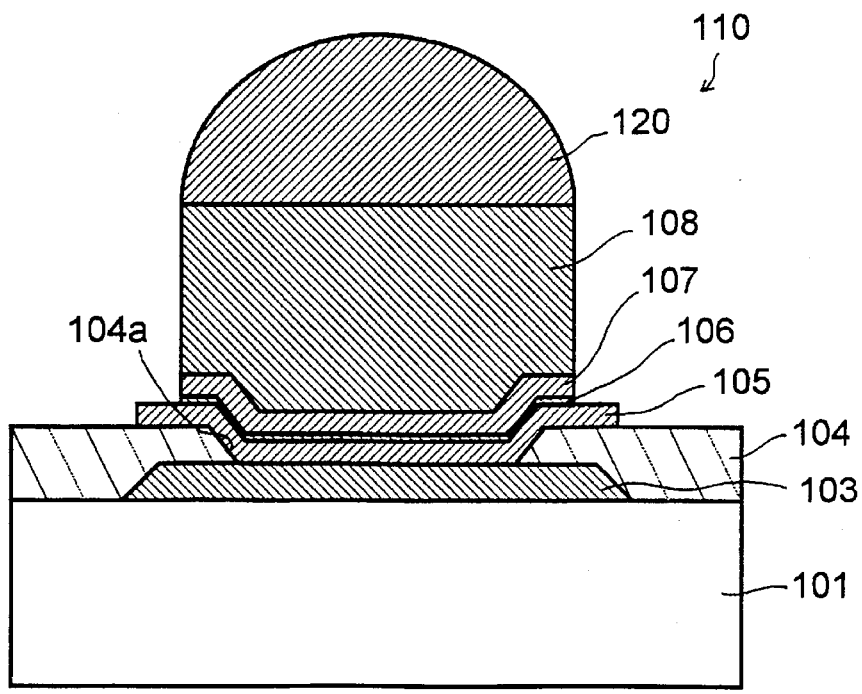
FIG. 6 is a cross-sectional view illustrating the composition of a second embodiment according to the present invention.

FIG. 6 illustrates the construction of the second embodiment according to the present invention.

A bump structure 110 is composed of an Al pad (metallic film) 103 provided on a wiring to connect elements disposed on a silicon substrate 101, a passivation film (insulating film) 104 made of SiN in which a contact hole 104a whose diameter is smaller than the diameter of the Al pad 103 is made in the position of the Al pad 103 to protect the wiring and the element, a barrier metal 105 made of TiN, a bonding layer 106 made of Ti whose diameter is smaller than the diameter of the barrier metal 105, a Cu film (bump growing Cu film) 107 made of Cu whose diameter is the same as the diameter of the bonding layer 106, a columnar bump part 108 made of Cu whose diameter is the same as the diameter of the Cu film 107, and a solder bump 120 made of solder, these components being stacked on top of another.

The barrier metal 105 is formed to a film thickness of 200 to 300 nm, the bonding layer 106 is formed to a film thickness of 5 to 80 nm, the Cu film 107 is formed to a film thickness of 500 to 1000 nm, and the columnar bump part 108 is formed to a film thickness of 10 to 50 μm. The diameter of the barrier metal 105 is formed to be larger than the diameter of the bonding layer 106 by 8 to 12 μm.

In the above construction, the diameter of the barrier metal 105 is formed to be larger than the diameter of the bonding layer 106. However, in comparison with the bonding strength between the barrier metal 105 and the bonding layer 106 and the bonding strength between the bonding layer 106 and the Cu film 107, the bonding strength between the barrier metal 105 and the Al pad 103 or the bonding strength of the passivation film 104 and the barrier metal 105 is lower. Therefore, by forming the diameter of the barrier metal 105 larger than the diameter of the bonding layer 106, the strength of the bump structure 110 can be improved.

Figure 8:
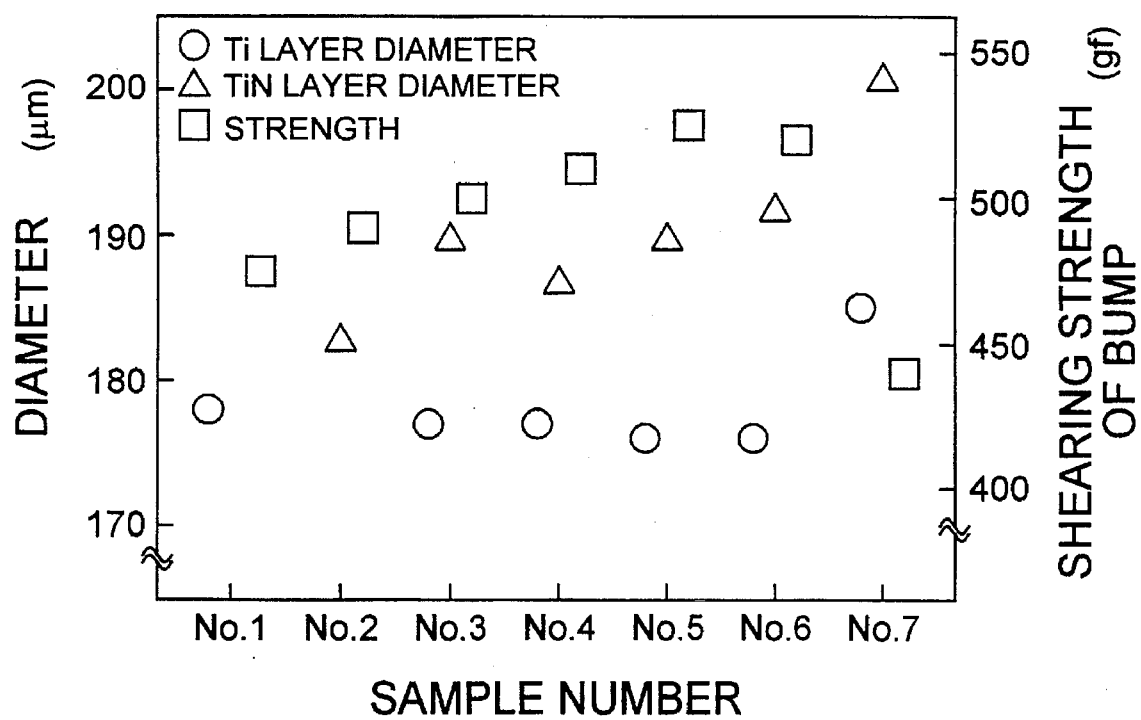
FIG. 8 is a graph showing the relationship among the barrier metal diameter, the bonding layer diameter, and the shearing strength of the bump.
Figure 9:
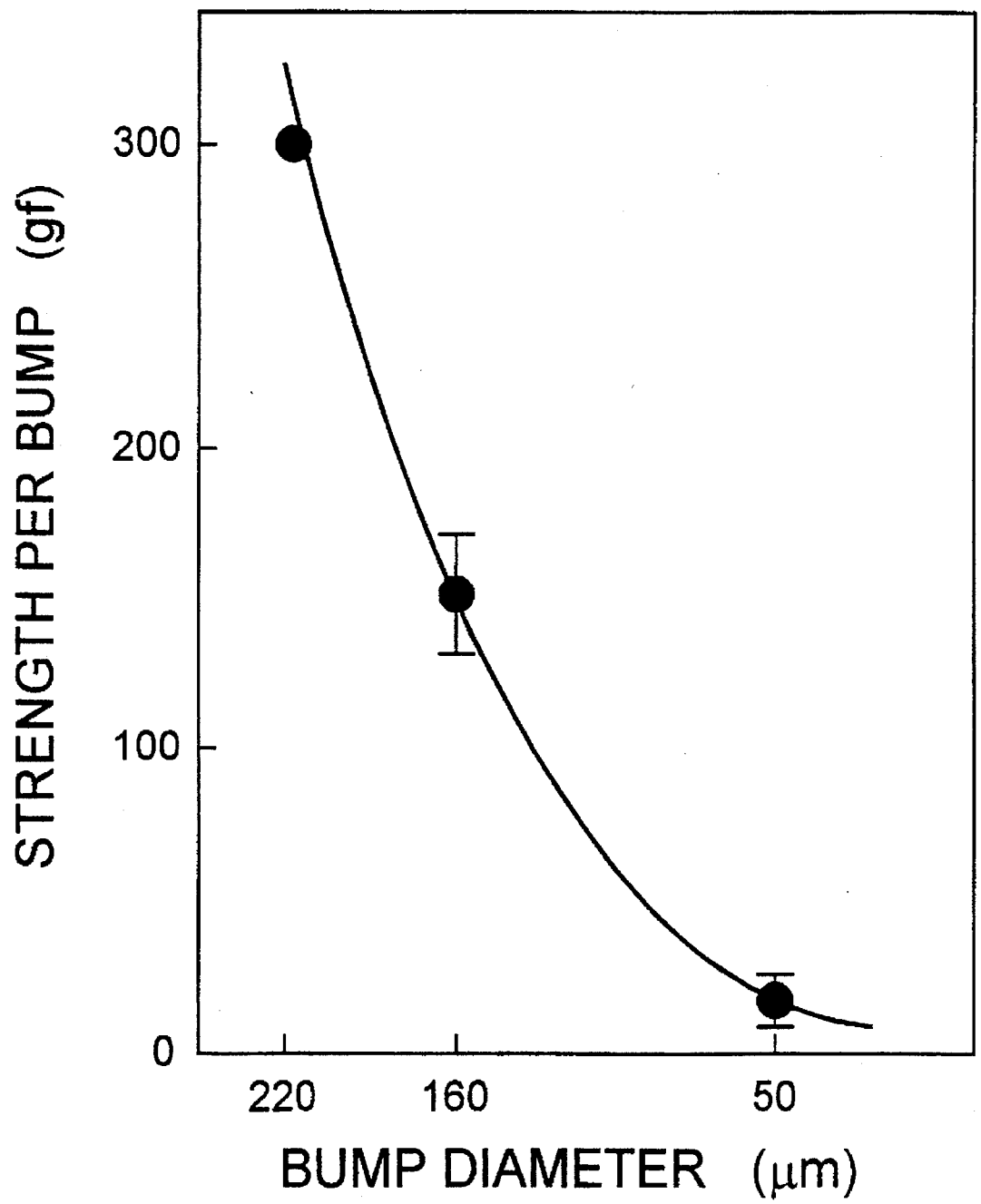
FIG. 9 is a graph showing the relationship between the bump diameter and bump strength.
Figure 10:
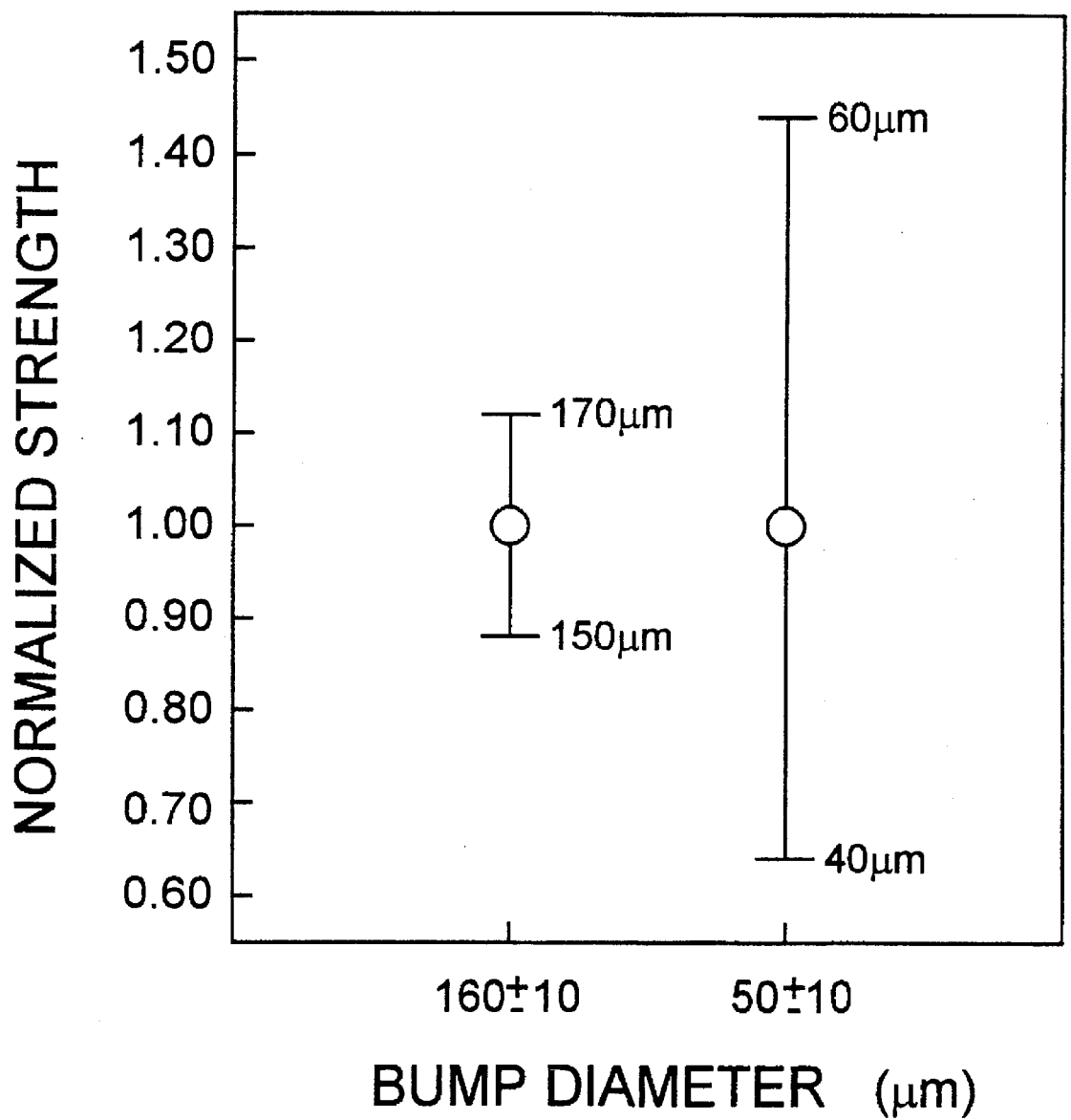
FIG. 10 is a graph showing the relationship between the dispersion in the bump diameter and the dispersion in the bump strength.

Table 1 and FIG. 8 show the relationship between the diameter of the barrier metal 105 and the shearing strength of the bump structure 110. From Table 1 and FIG. 8, it is understood that, as the diameter of the barrier metal 105 becomes larger, the shearing strength of the bump structure 110 becomes higher.

TABLE 1

| SAMPLE | BONDING LAYER (Ti) | | BARRIER METAL LAYER (TiN) | | BONDING STRENGTH (g) |
|---|---|---|---|---|---|
| | THICKNESS (nm) | DIAMETER (μm) | THICKNESS (nm) | DIAMETER (μm) | |
| No. 1 | 300 | 178 | — | — | 475 |
| No. 2 | — | — | 250 | 183 | 490 |
| No. 3 | 5 | 177 | 250 | 190 | 500 |
| No. 4 | 20 | 177 | 250 | 187 | 510 |
| No. 5 | 40 | 176 | 250 | 190 | 525 |
| No. 6 | 80 | 176 | 250 | 192 | 520 |
| No. 7 | 160 | 185 | 250 | 201 | 440 |

Accordingly, by forming the diameter of the barrier metal 105 larger than the diameter of the bonding layer 106, the bonding strength between the Al pad 103 and the barrier metal 105 and the bonding strength between the passivation film 104 and the barrier metal 105 can be improved so much that there is no exfoliation between the Al pad 103 and the barrier metal 105 or exfoliation between the passivation film 104 and the barrier metal 105, and the shearing strength of the bump structure 110 can be improved.

On the other hand, as illustrated in FIG. 8, when the film thickness of the bonding layer 106 made of Ti is 5 to 80 nm, the shearing strength of the bump structure 110 becomes higher as the diameter of the barrier metal 105 increases. If the film thickness of the bonding layer 106 becomes too thick, however, as described in the first embodiment above, despite the larger diameter of the barrier metal 105, the Ti film is made vulnerable due to hydrogen annealing, and the shearing strength of the bump structure 110 lowers.

Therefore, by setting the film thickness of the bonding layer 6 to 2 to 100 nm, preferably to 5 to 80 nm, the shearing strength of the bump structure 110 can be maintained to a constant level.

When the barrier metal is composed of a Ti layer (sample No. 1), the Ti film is made embrittlement due to hydrogen annealing, and the shearing strength of the bump structure 110 lowers, while when the barrier metal is composed only of a TiN layer (sample No. 2), the adhesiveness to the upper Cu film is not sufficient.

Description will now be given to the manufacturing method of the bump structure 110 referring to FIGS. 7A through 7E.

Figure 7A:
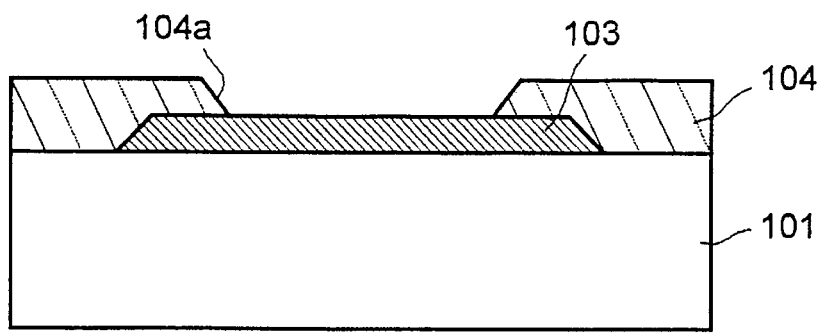
FIGS. 7A, 7B, 7C, 7D and 7E are cross-sectional views illustrating the manufacturing process of the semiconductor device according to the second embodiment.

On the element disposed on the silicon substrate 110 is formed an Al wiring, and on a part of the Al wiring is formed the Al pad 103. Then, in order to protect the element and the Al wiring formed on the silicon substrate 101, over the silicon substrate 101 and the Al pad 103 is formed the passivation film 104 made of SiN in which the hole 104a whose diameter is smaller than the width of the Al pad 103 is formed in the position of the Al pad 103 (FIG. 7A).

On the surface of the silicon substrate 101 on the side where the passivation film 104 has been formed is formed the barrier metal 105 by sputtering TiN to a film thickness of 200 to 300 nm. Then, on the barrier metal 105 is formed the bonding layer 106 by sputtering Ti to a film thickness of 5 to 80 nm.

Figure 7B:
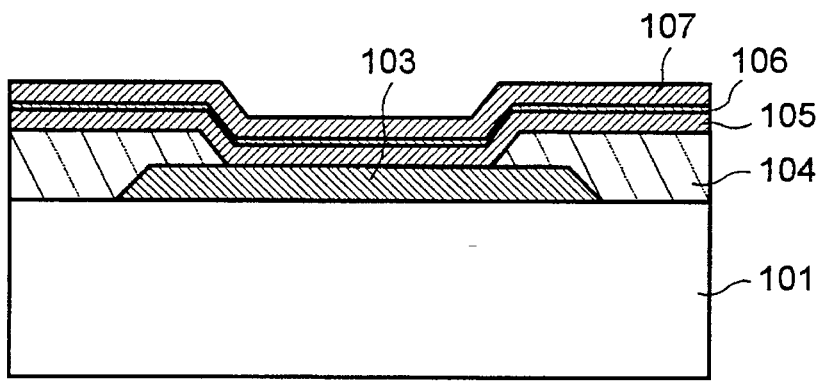

After the formation of the bonding layer 106, the Cu film 107 made of Cu is formed to a film thickness of 500 to 1000 nm (FIG. 7B).

Figure 7C:
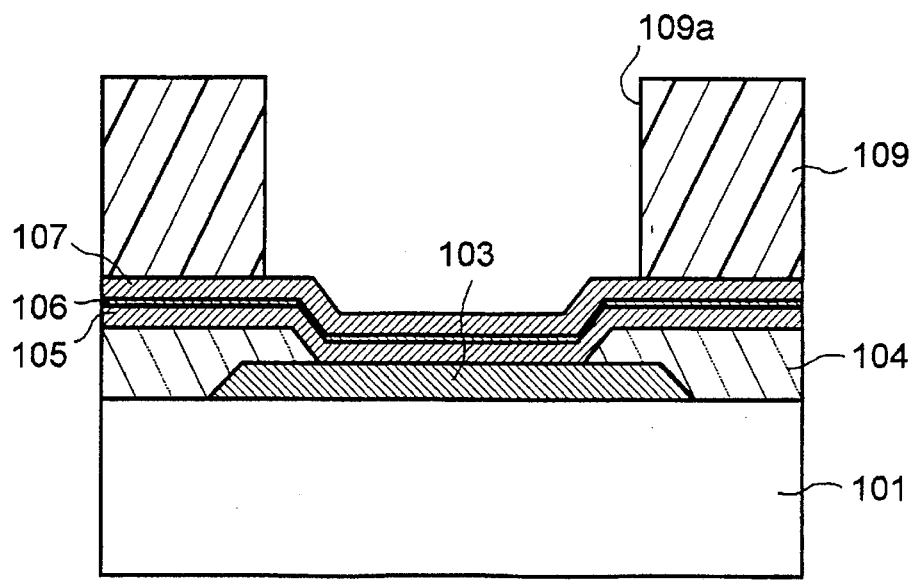

After the formation of the Cu film 107, a photoresist 109 is deposited on the Cu film 107. Then, the work in process is exposed and developed in the photolithographic process to form in the photoresist 109 a hole 109a in a specified position into a specified shape to form the bump structure 110 in the specified position into the specified shape (FIG. 7C).

Figure 7D:
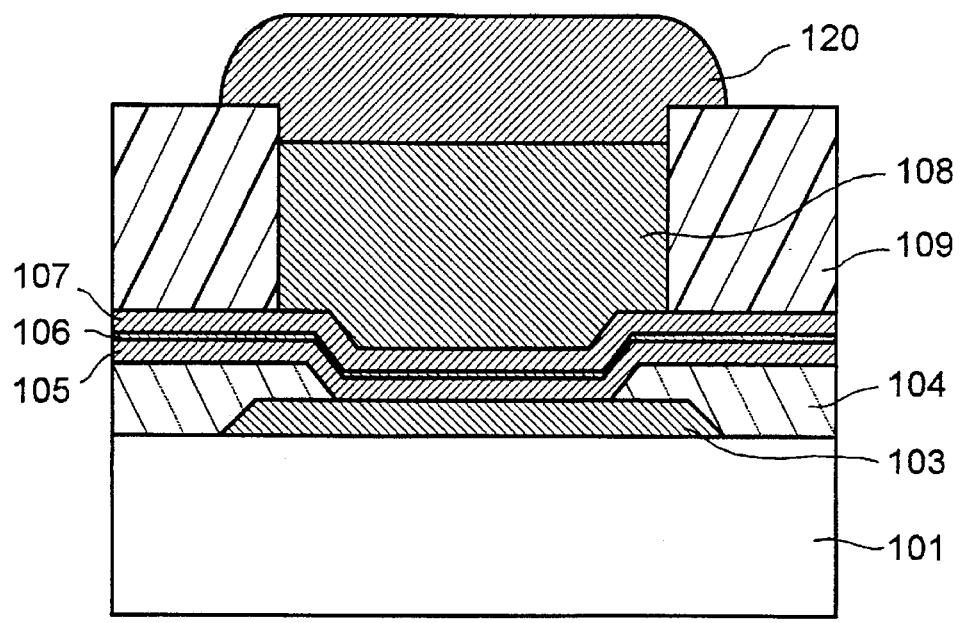

In a position where the hole 109a has been formed is formed the columnar bump part 108 by plating (electrolytic or electroless) to a film thickness of 10 to 50 µm (e.g., Cu film by copper sulfate plating). In a case of applying an electrolytic plating, the underlying Cu film 107 is used as an electrode film for growing a plated film thereon. After the formation of the columnar bump part 108, to the columnar bump part 108 is applied solder plating by means of organic acid bathing or borofluoric acid bathing to form the solder bump 120 (FIG. 7D).

After the formation of the solder bump 120, the photoresist 109 is removed.

Following this, the Cu film 107 composed of Cu is etched with an etching liquid which can selectively etch only Cu using the columnar bump part 108 as an etching mask.

Then, both the Ti film (bonding layer 106) and the TiN film (barrier metal 105) are etched together with a Ti etching liquid of ethylenediaminetetraacetic acid (EDTA) type.

Here, the temperature of the Ti etching liquid is 60±5° C., and the composition thereof is as follows:

EDTA: 10~20 g (per $H_2O$ 1 liter)
$H_2O_2$: 280~440 ml (per $H_2O$ 1 liter)
$NH_4OH$: 24~36 ml (per $H_2O$ 1 liter)

The etching rate (vertical) of the EDTA type Ti etching liquid at 60° C. is 3.75 nm/sec for the Ti film and the etching rate for the TiN film is 2.15 nm/sec. By composing the barrier metal 105 and the bonding layer 106 with respective materials of different etching rates for the same etching liquid, particularly by composing the bonding layer 106 with a material having a higher etching rate for the same etching liquid than the etching rate of the underlying barrier metal 105, the bonding layer 106 is formed to the same diameter as the diameter of the columnar bump part 108 and the barrier metal 105 to the diameter larger than the diameter of the columnar bump part 108 by 8 to 12 µm.

Figure 7E:
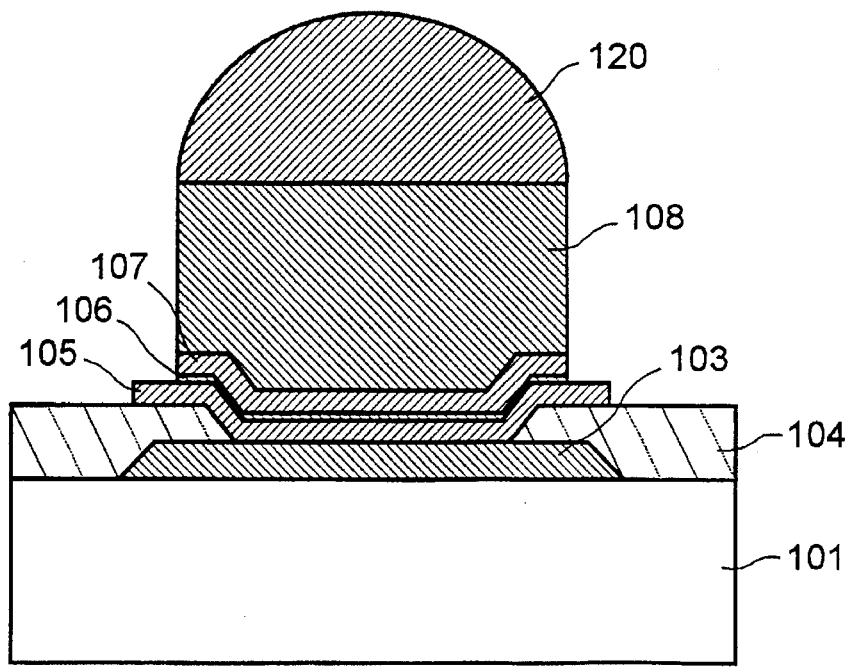

As the last step, by reflowing the solder bump 120 by heat treatment, the bump structure 110 is formed (FIG. 7E).

As described above, when forming the barrier metal 105 positioned at the root part of the bump structure 110, the bonding layer 106 is interposed between the barrier metal 105 and the Cu film 107 to improve the adhesiveness therebetween. The material having the lower etching rate is used for the lower barrier metal 105, and the material having the higher etching rate is used for the upper bonding layer 106. In this arrangement, by etching both the barrier metal 105 and the bonding layer 106 together with the same etching liquid using the columnar bump part 108 as an etching mask, the upper bonding layer 106 can be formed to the same diameter as the diameter of the columnar bump part 108 and the lower barrier metal 105 can be formed to the diameter larger than the diameter of the columnar bump part 108 by 8 to 12 µm. As a result, the bonding area between the barrier metal 105 and the Al pad 103 and the bonding area between the barrier metal 105 and the passivation film 104, each individual bonding strength of which is low, can be enlarged. This can improve the bonding strength between the barrier metal 105 and the Al pad 103 and the bonding strength between the barrier metal 105 and the passivation film 104 to such an extent that there is no exfoliation, and the shearing strength of the bump structure 110 can be improved.

On the other hand, the bonding area between the barrier metal 105 and the bonding layer 106 and the bonding area between the bonding layer 106 and the Cu film 107 are smaller than the bonding area between the barrier metal 105 and the Al pad 103 and the bonding area between the barrier metal 105 and the passivation film 104. As the bonding strength is high, there is no exfoliation, and the shearing strength of the bump structure 110 can be maintained.

Furthermore, by using the above method, the bump structure 110 can be formed so precisely that there is no dispersion in the strength thereof, and therefore, the bump structure 110 of high quality can be manufactured.

In this embodiment, TiN is used for the barrier metal 105. However, the material should not be limited to TiN, but when the bonding layer 106 is made of Ti, Ti alloy such as $TiO_2$ and TiC may be used for the barrier metal 105.

In this embodiment, Ti is used for the bonding layer 106. However, the material should not be limited to Ti but Zr may be used. When Zr is used, $ZrO_2$, ZrN, etc. may be used for the barrier metal 105. In short, different materials having different etching rates on the same etching liquid should used, and the material having the lower etching rate should be used for the underlying layer (barrier metal 105) and the material having the higher etching rate should be used for the upper layer (bonding layer 106).

Some target products (e.g., IC cards, liquid crystal products, cellular telephones) do not need any solder bump. If dry etching is applied to the barrier metal 105, the bonding layer 106, the base film 107 and the bump part 108 together with $Cl_2$, $BCl_3$, $CF_4$ or the like, as the etching rate of the barrier metal 105 is lower than the etching rate of the bonding layer 106, the specified shape can be obtained.

In addition, although the embodiment forms the passivation film 104 with SiN, the present invention does not limit to this composition, but a $SiO_2$ film or the like may be used as an insulating film.

As described above, according to the second embodiment, the electrode root part is of double-layer structure, the material having the higher etching rate is used for the upper layer of the electrode root part, the material having the lower etching rate is used for the lower layer of the electrode root part, the upper layer and the lower layer are etched simultaneously with the same etching liquid, and the diameter of the lower layer is formed larger than that of the bump part by 8 to 12 µm to improve the shearing strength of the bump structure and form the bump structure so precisely that there is no dispersion in the shearing strength of the bump structure, and thereby the strength and quality of the bump structure can be improved.

Furthermore, by forming the upper layer of the electrode root part with Ti to a film thickness of 2 to 100 nm, preferably 5 to 80 nm, the Ti film is not made vulnerable despite hydrogen annealing. Therefore, the shearing strength of the bump structure can be maintained to a constant level.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:

a substrate;

a copper (Cu) film used for an electrode material or a wiring material;

a TiN barrier metal disposed between said substrate and said Cu film; and a bonding layer made of titanium (Ti) disposed between said Cu film and said barrier metal, a film thickness of said bonding layer being between 2 nm and 100 nm.

2. A semiconductor device comprising:

a semiconductor element provided on a semiconductor chip;

a metallic film formed on a surface of said semiconductor chip;

an insulating film formed on said metallic film and having a contact hole for exposing a part of said metallic film;

a barrier metal formed on the metallic film within said contact hole;

a bonding layer made of titanium (Ti) formed on said barrier metal;

a bump growing film made of copper (Cu) formed on said bonding layer; and a columnar metallic bump formed on said bump growing film.

3. A semiconductor device according to claim 2, wherein a diameter of a root part of said columnar metallic bump is 30 μm or more.

4. A semiconductor device according to claim 2, wherein a diameter of said barrier metal is larger than a diameter of said bonding layer.

5. A semiconductor device according to claim 4, wherein said diameter of said bonding layer is equal to a diameter of a root part of said columnar metallic bump.

6. A semiconductor device comprising:

a semiconductor element provided on a semiconductor chip;

a metallic film formed on said semiconductor element;

a metallic bump structure for making contact with said semiconductor element and a wiring provided on an external substrate, provided on a part of said metallic film; and interposed layers interposed between said metallic film and said bump structure, including:

a barrier metal layer formed on said metallic film;

a bonding layer made of Ti and formed on said barrier metal layer; and a bump growing layer made of Cu and formed on said bonding layer, wherein said metallic bump structure is formed on said bump growing layer.

7. A semiconductor device according to claim 6, wherein said barrier metal layer is of a material selected from the group consisting of TiN, W, TiW, W-N and TiW-N.

8. A semiconductor device according to claim 6, wherein said bonding layer is substantially made of only Ti.

9. A semiconductor device according to claim 6, wherein a film thickness of said bonding layer is between 2 nm and 100 nm.

10. A semiconductor device according to claim 6, further comprising an insulating film formed on said metallic film, said insulating film including a contact hole at a portion corresponding to a part of said metallic film, wherein said interposed layers contacts said metallic film through said contact hole of said insulating film.

11. A semiconductor device according to claim 10, wherein said diameter of a root part of said metallic bump structure is larger than a diameter of said contact hole of said insulating film.

12. A semiconductor device according to claim 11, wherein said diameter of said root part of said metallic bump structure is 30 μm or more.

13. A semiconductor device according to claim 11, wherein a diameter of said bonding layer is substantially equal to said diameter of said root part of said metallic bump structure.

14. A semiconductor device according to claim 13, wherein a diameter of said barrier metal layer is larger than said diameter of said bonding layer.

15. A semiconductor device according to claim 14, wherein said barrier metal layer is of a compound metal including Ti.

16. A semiconductor device according to claim 15, wherein said compound metal making up said barrier metal layer has resistant to an embrittlement by hydrogen.

17. A semiconductor device according to claim 16, wherein a film thickness of said bonding layer is between 2 nm and 100 nm.

18. A semiconductor device according to claim 17, wherein said film thickness of said bonding layer is between 5 nm and 80 nm.

* * * * *